(12) United States Patent
Kim et al.

(10) Patent No.: US 9,940,232 B1
(45) Date of Patent: Apr. 10, 2018

(54) POST-PROGRAM CONDITIONING OF STACKED MEMORY CELLS PRIOR TO AN INITIAL READ OPERATION

(71) Applicant: Seagate Technology LLC, Cupertino, CA (US)

(72) Inventors: Young Pil Kim, Eden Prairie, MN (US); Antoine Khoueir, Apple Valley, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/427,825

(22) Filed: Feb. 8, 2017

(51) Int. Cl.
  *G11C 16/12* (2006.01)
  *G06F 12/02* (2006.01)
  *G11C 16/10* (2006.01)
  *G11C 16/28* (2006.01)
  *G11C 16/34* (2006.01)
  *G11C 16/14* (2006.01)

(52) U.S. Cl.
  CPC .......... *G06F 12/0246* (2013.01); *G11C 16/10* (2013.01); *G11C 16/14* (2013.01); *G11C 16/28* (2013.01); *G11C 16/3459* (2013.01); *G06F 2212/7201* (2013.01)

(58) Field of Classification Search
  CPC .......... G11C 16/10; G11C 16/14; G11C 16/28; G11C 16/3459; G06F 12/0246
  USPC ................................................. 365/185.24
  See application file for complete search history.

(56) References Cited

U.S. PATENT DOCUMENTS

| | | | |
|---|---|---|---|
| 5,511,022 A | 4/1996 | Yim et al. | |
| 6,646,922 B2 | 11/2003 | Kato | |
| 7,177,191 B2 | 2/2007 | Fasoli et al. | |
| 9,019,775 B2 | 4/2015 | Costa et al. | |
| 9,111,800 B2 | 8/2015 | Scheuerlein | |
| 9,142,302 B2 | 9/2015 | Dong et al. | |
| 9,230,665 B2 * | 1/2016 | Hosono | G11C 11/5628 |
| 9,236,393 B1 | 1/2016 | Cernea | |
| 9,318,209 B1 | 4/2016 | Huynh et al. | |
| 2004/0170079 A1 | 9/2004 | Leung | |
| 2005/0013164 A1 | 1/2005 | Kato | |
| 2005/0281112 A1 | 12/2005 | Ito | |
| 2009/0116270 A1 | 5/2009 | Scheuerlein | |
| 2013/0070530 A1 | 3/2013 | Chen | |
| 2013/0141971 A1 * | 6/2013 | Hosono | G11C 11/5628 365/185.02 |
| 2013/0258770 A1 | 10/2013 | Goss | |

(Continued)

*Primary Examiner* — Richard Elms
*Assistant Examiner* — Xiaochun L Chen
(74) *Attorney, Agent, or Firm* — Hall Estill Attorneys at Law

(57) ABSTRACT

Method and apparatus for managing data in a stacked semiconductor memory, such as but not limited to a three dimensional (3D) NAND flash memory array. In some embodiments, a data set is written to the memory array by programming a stack of memory cells to a desired set of program states. A first set of pulses is applied to verify the memory cells conform to the desired set of program states. The verified stack of memory cells are subsequently conditioned by applying a second set of pulses to remove accumulated charge from a shared channel region of the stack. The conditioning of the memory cells reduces a step-wise increase in the number of read errors during the first read operation as compared to subsequent read operations on the memory cells.

20 Claims, 7 Drawing Sheets

(56) References Cited

U.S. PATENT DOCUMENTS

| | | | |
|---|---|---|---|
| 2014/0063972 A1* | 3/2014 | Maeda | G11C 16/0483 365/185.22 |
| 2016/0056050 A1 | 2/2016 | Kong et al. | |
| 2016/0056168 A1 | 2/2016 | Lue | |
| 2016/0180946 A1 | 6/2016 | Hong | |
| 2017/0236595 A1 | 8/2017 | Maejima | |

* cited by examiner

READ/PROGRAM VERIFY (PV) CIRCUIT

PROGRAMMING CIRCUIT

POST-PROGRAM CONDITIONING OF STACKED MEMORY CELLS PRIOR TO AN INITIAL READ OPERATION

SUMMARY

Various embodiments disclosed herein are generally directed to the management of data in a stacked memory array, such as but not limited to a three dimensional (3D) NAND flash memory array.

In accordance with some embodiments, a method includes programming a stack of memory cells in a three-dimensional (3D) non-volatile semiconductor memory array to a desired set of program states. A first set of pulses is applied to verify the stack of memory cells conforms to the desired set of program states. Once verified, a different, second set of pulses is applied to condition the verified stack of memory cells by removing accumulated charge from a shared channel region of the stack.

In other embodiments, a method includes programming a data set to a stack of memory cells in a three-dimensional (3D) non-volatile semiconductor memory array by applying a sequence of charge pulses to respectively accumulate different amounts of charge within the memory cells corresponding to bit values of the data set A first sequence of program verify (PV) pulses is applied to verify the respective different amounts of charge are set at desired programmed logical states corresponding to the bit values of the data set. A second sequence of PV pulses is applied to the memory cells after each of respective different amounts of charge have been verified as corresponding to the desired programmed logical states to condition the memory cells prior to an initial read operation to subsequently transfer the data set to a host device.

In other embodiments, a data storage device has a three-dimensional (3D) non-volatile semiconductor memory array with a plurality of stacks of memory cells, each stack of memory cells sharing a central channel region. A control circuit is configured to program a selected stack of memory cells to a desired set of program states by applying a first set of pulses to the selected stack. The control circuit verifies the memory cells in the selected stack conform to the desired set of program states by applying a second set of pulses to the selected stack. The control circuit conditions the memory cells in the selected stack by applying a third set of pulses to the selected stack. The third set of pulses removes accumulated charge in the central channel region of the selected stack.

These and other features and advantages which may characterize various embodiments can be understood in view of the following detailed discussion and the accompanying drawings.

DETAILED DESCRIPTION

Figure 1:
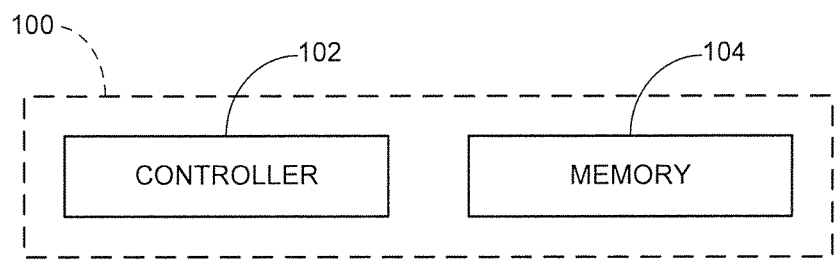
FIG. 1 provides a functional block representation of an exemplary data storage device in accordance with some embodiments.

The present disclosure generally relates to the management of data in a stacked semiconductor memory, such as but not limited to a three dimensional (3D) NAND flash memory array.

Data storage devices are provided with one or more memory devices to store and/or retrieve computerized data. Some solid-state semiconductor based memory devices, such as flash memory, utilize the transfer of charge to establish programming states in individual memory cells.

Flash memory stores data in the form of accumulated charge on floating gates of flash memory cells. The memory cells may be characterized as nMOSFETs (n-channel metal oxide semiconductor field effect transistors) with a floating gate structure that is electrically isolated from a main control gate of each transistor. The memory cells store substantially no accumulated charge on the floating gates in an erased state, and store increased amounts of accumulated charge when programmed. Programming operations cause migration of charge from the main channel to the floating gates, and erasure operations migrate charge from the floating gates to reset the cells to a base (erased) state. One or more bits may be stored in each programmed cell.

Some NAND flash devices arrange the flash memory cells in a stacked, or three dimensional (3D) array configuration. Each stack of flash memory cells may include any number of flash cells with the various gate structures accessed by control lines (e.g., bit lines, source lines, word lines, selection lines, etc.) that extend through the array. A number of different 3D NAND configurations are known in the art, including a gate stack type NAND flash memory where channel current flows vertically and gates are horizontally shared, and a channel stack type NAND flash memory where channel current flows horizontally and the gates are vertically shared.

The use of 3D NAND flash and other forms of stacked semiconductor memory configurations can provide a number of advantages, including increased data storage capacity for a given semiconductor footprint. Semiconductor lithography techniques are often limited to a minimum feature (F) size, usually on the order of a few tens of nanometers (e.g., 19 nm, 25 nm, 45 nm, etc.). The memory cell dimensions in the horizontal direction are largely constrained by the minimum feature size of the associated semiconductor fabrication process. By growing the stack vertically, however, many "horizontal layers" of memory cells can be incorporated into the same device, significantly increasing the overall total number of memory cells in the array.

While operable, some forms of 3D NAND flash memory arrays may experience a higher than normal number of bit errors during the first data read operation upon a given set of data after the data have been programmed to the array. This condition is referred to herein as a "first read effect" or "floating body effect" where a step-function improvement in error rate is observed between the first read operation on the data and subsequent read operations on the data.

As a result of an investigation into this phenomenon, it has been determined that residual charge may tend to accumulate within the channel body at least at certain locations within the array during the program operation. This accumulated charge does not affect the amounts of charge that have been stored to the floating gate structures. However, the presence of this additional charge interferes with the initial sensing of the floating gate states, causing misreads in the programmed bit values in the memory cells.

In theory, it is believed that this effect should not be observed since most programming operations include a follow up read verify (RV) operation, also referred to as a program verify (PV) operation, to verify that the final desired programming states have been achieved. The application of the PV operation should be sufficient to drain any residual charge from the channel.

Accordingly, various embodiments of the present disclosure are generally directed to an apparatus and method for managing data in a stacked semiconductor memory array, such as but not limited to a 3D NAND flash memory array.

As explained below, some embodiments include programming a stack of non-volatile memory elements by applying a sequence of charge pulses to respectively accumulate different amounts of charge on the memory elements to program the elements to desired program (logical) states. A first sequence of program verify pulses is applied to verify the respective different amounts of charge correspond to the desired program states.

Once the correct program states have been verified, a second sequence of program verify pulses is applied to remove charge from a body portion of the stack of non-volatile memory elements. The second sequence of program verify pulses are supplied at a voltage that is lower than the first sequence of program verify pulses.

A first read operation is subsequently applied responsive to a host access command to transfer the originally programmed data to a host device, the first read operation constituting the first time the previously stored data are retrieved after the programming operation. In this way, the first read operation will tend to provide a similar number of bit errors as subsequent read operations for the same set of data from the memory elements.

These and other features and aspects of various embodiments will be understood beginning with a review of FIG. 1 which generally illustrates an exemplary data storage device 100. The device 100 includes a controller 102 and a memory module 104. The controller 102 provides top level control for the device 100 and may be configured as a programmable processor with associated programming in local memory. Additionally or alternatively, the controller may take the form of a hardware based control circuit with logic gates or other elements to carry out the required controller functions.

The memory module 104 can be arranged as one or more non-volatile memory elements including rotatable recording discs and solid-state memory arrays. While a separate controller 102 is shown in FIG. 1, such is unnecessary as alternative embodiments may incorporate any requisite controller functions directly into the memory module. While not limiting, for purposes of the present discussion it will be contemplated that the data storage device 100 is a solid-state drive (SSD) that utilizes a three dimensional (3D) NAND flash memory array that makes up at least some of the memory capacity of the memory module to provide a main data store for a host device (not shown). Other forms of stacked semiconductor memory can be used.

Figure 2:
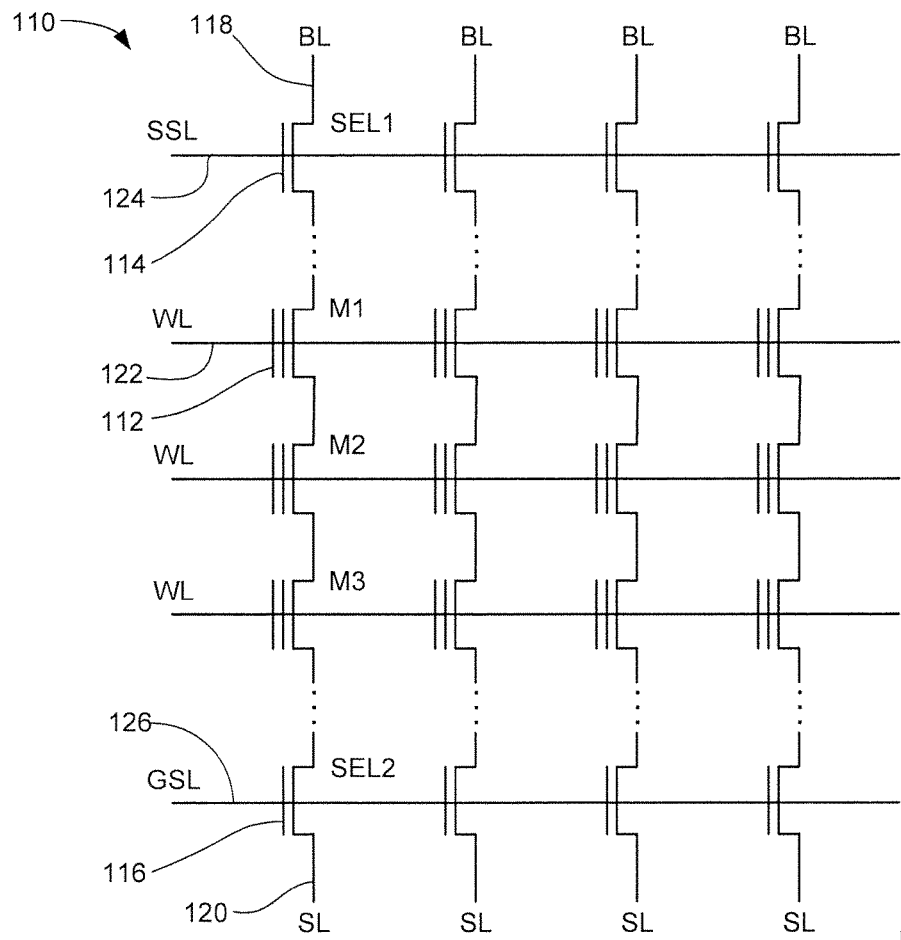
FIG. 2 is a schematic depiction of a portion of a stacked, or three dimensional (3D) NAND flash memory array of the device of FIG. 1 in some embodiments.

FIG. 2 provides a schematic depiction of a portion of a 3D NAND flash memory array 110 of the memory module 104 of FIG. 1 in accordance with some embodiments. Other configurations can be used so that FIG. 2 is merely exemplary and not limiting. The arrangement in FIG. 2 is a two dimensional (2D) layout similar to a conventional 2D NAND configuration. It is contemplated albeit not required that each column in FIG. 2 represents a vertical stack of elements within the 3D array.

A number of flash memory cells 112 are denoted as M1, M2 and M3. Any suitable number of the flash memory cells 112 can be provided in each stack. The memory cells 112 are bounded by a first selection device 114 (SEL1) and a second selection device 116 (SEL2). The selection devices may each take a MOSFET transistor configuration.

A bit line (BL) 118 (upper control line) connects to one end of each stack and a source line (SL) 120 (lower control line) connects to the opposing end. During normal program (write) and read operations, current is passed from the BL to the SL through each stack in turn. This may take place by connecting the BL to a suitable rail voltage, such as 3.3V, and connecting the SL to a suitable reference level, such as electrical ground. A series of word lines (WL) 122 are connected to control gate structures of the memory cells 112. Variable gate control voltages are supplied to the memory cells 112 via the WLs. Separate selection control lines 124 and 126 (SSL and GSL) are used to select the select devices 114, 116.

A page of data may be stored along the memory cells 112 attached to a common word line, so that a single bit of a given page is stored in each memory cell along a given row. Groups of the memory cells may be arranged into higher operable units, such as erasure blocks which constitute the smallest number of the memory cells that can be erased at a time. Garbage collection units (GCUs) may be formed from multiple erasure blocks. The GCUs may be allocated and garbage collected as a unit to recondition and reallocate after use.

Figure 3:
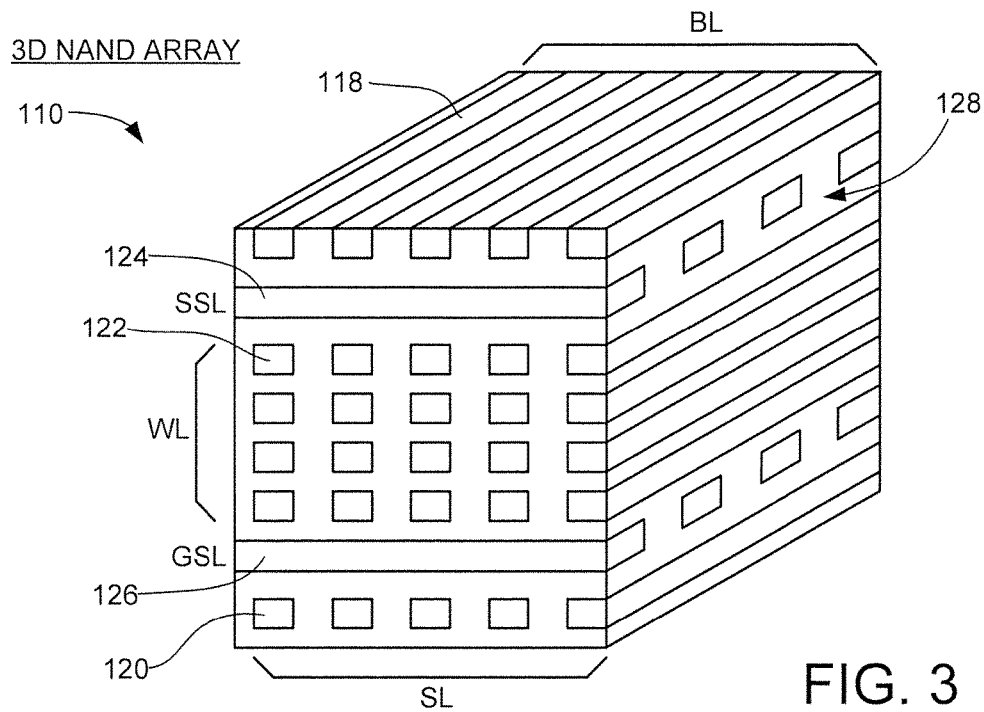
FIG. 3 is a simplified isometric representation of the stacked flash memory array in some embodiments.

FIG. 3 shows a portion of the 3D NAND flash memory array 110 from FIG. 2. The various control lines (e.g., BLs, SLs, WLs, SSLs, GSLs) are shown to extend through a main body portion 128 of the array 110 in respective parallel or orthogonal directions to make the requisite interconnections to access the various internally disposed memory cells 112. Any number of other arrangements can be used so that FIG. 3 is merely illustrative and is not limiting.

Figure 4:
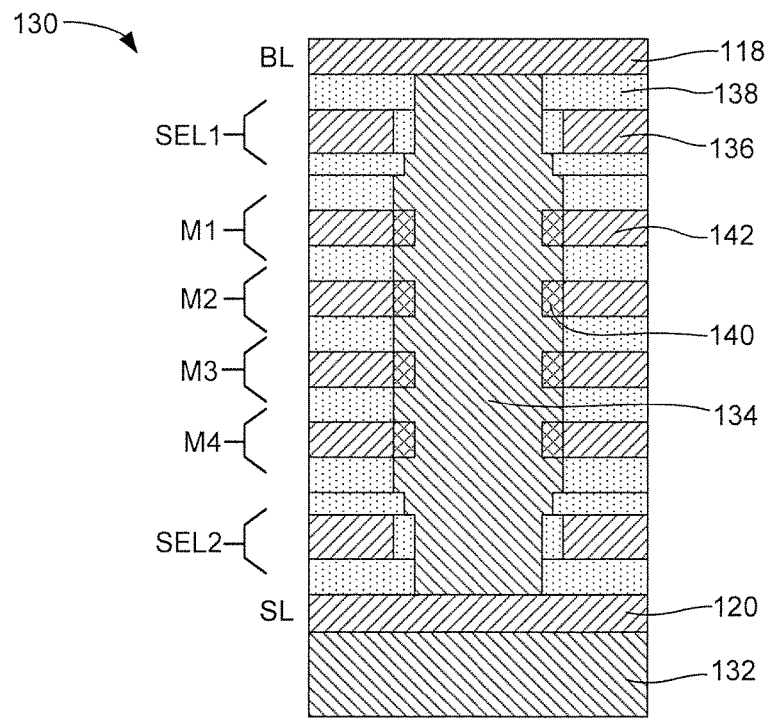
FIG. 4 is a cross-sectional representation of a stack of memory cells of the array of FIG. 3.

FIG. 4 shows a portion of the 3D NAND flash memory array 110 from FIG. 3 to illustrate aspects of a single stack 130 within the array 110. The diagram is somewhat simplified for clarity of illustration and, as before, other arrangements can be used as desired. The array 110 is built using known semiconductor fabrication techniques on an underlying substrate 132.

The various memory cells and selection devices from FIG. 2 (e.g., M1, SEL1, etc.) are generally indicated in FIG. 4, and are annular (circular) in nature so as to surround a central channel region 134. These elements are formed from different regions of conductive material such as regions 136 and insulative material such as regions 138. Other layers may be incorporated, such as insulative barrier layers between the BL, SL and the channel, but such are not shown for clarity. It will be noted that each of the memory cells M1-M4 share the common channel region 134.

Thin film floating gate structures are generally denoted at 140. The floating gates are electrically insulated from the central channel region 134 and control gate portions 142 of the memory cells 112. The program state of the various memory cells M1-M4 are established by accumulating charge on the respective floating gates 140. The floating body effect (first read effect) may arise as a result of trapped accumulated charge within the stack 130, such as within the central body channel 134 or other locations depending on the construction of the stack.

Figure 5:
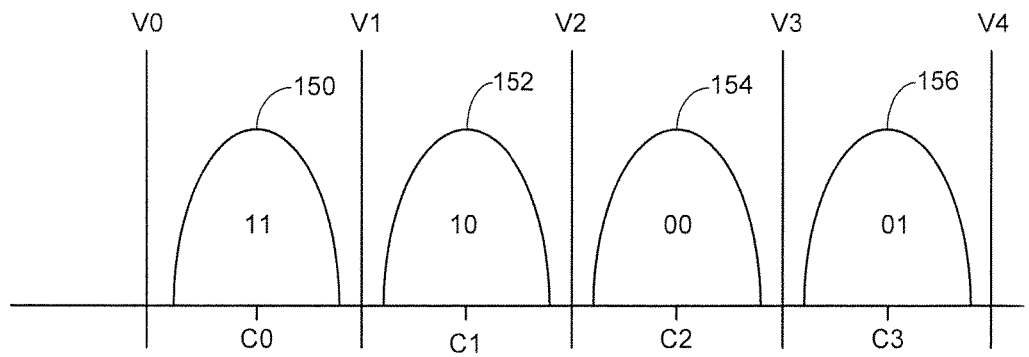
FIG. 5 shows charge distributions indicative of different data storage states for the flash memory cells in the stacked flash memory array.

In order to set forth a detailed explanation of how various embodiments of the present disclosure mitigate the floating body effect, it will be helpful to first briefly discuss FIG. 5 which shows a sequence of charge distributions 150, 152, 154 and 156. These distributions represent different groupings of memory cells 112 from the array 110 that are programmed to different program states during normal programming operations.

While not limiting, it is contemplated that the various memory cells 112 are operated as multi-level cells (MLCs) so that each memory cell stores two (2) bits of user data. The two bits may correspond to two different pages of data written to the same set of MLCs. The available program states are shown as logical 11, 10, 00 and 01, respectively. Other conventions can be used. The most significant bit (MSB) may correspond to a first page of data, and the least significant bit (LSB) may correspond to a second page of data. Other arrangements can be used, including single level cells (SLCs) which store only a single bit per memory cell, three-level cells (TLCs) which store three bits per memory cell, etc.

Distribution 150 in FIG. 5 represents a first population of the memory cells 112 programmed to a first nominal charge level C0 (logical 11) state. Distribution 152 represents a second population of cells programmed to a second nominal charge level C1 (logical 10); distribution 154 represents a third population of cells programmed to a third nominal charge level C2 (logical 00); and distribution 156 represents a fourth population of cells programmed to a fourth nominal charge level C3 (logical 01).

The populations are shown to be substantially Gaussian about the nominal charge levels C0<C1<C2<C3. The variations in charge level arise as a result of a variety of operational factors. For example, during programming a charge pump may be used to transfer discrete quanta of charge to the cells, and this process may result in slightly different total amounts of accumulated charge on individual cells programmed to the same state. Other contributing factors can including aging, manufacturing variations, temperature, etc.

Figure 6:
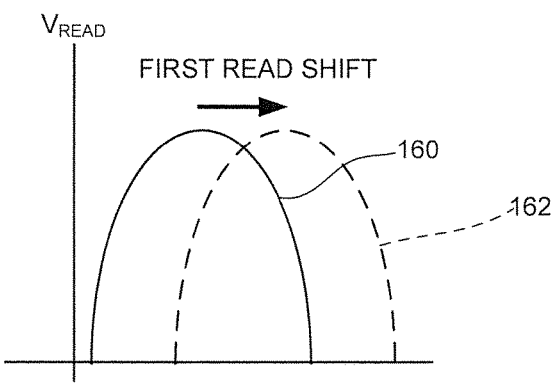
FIG. 6 illustrates an exemplary voltage shift that may arise during a first read operation after a programming operation for the memory cells of FIG. 5.

Normally, the distributions are sufficiently distinct such that intervening read sense voltages can be applied to differentiate between the respective distributions and identify the programmed state of a given cell. Four such read sense voltages are depicted in FIG. 6 as V1 through V4 with V1<V2<V3<V4. By way of illustration, the application of read sense voltage V3 to the control gates of the various flash cells in FIG. 2 (via word lines 122) would tend to be sufficient to place those cells in the distributions 150-154 into a conductive state (e.g., "turn on" the cells), whereas the cells in the remaining distribution 156 would remain in a non-conductive state. Voltage V0 would not turn on any of the memory cells, and voltage V4 would turn on all the cells.

The programmed state of any given cell can be sensed by the application of one or more of the sense voltages V1-V3 in a selected order. For example, a typical MLC read sequence might involve applying V2 to a given cell. If the cell turned on, V1 could then be applied to determine if the programmed state was 11 or 10. If the cell did not turn on, V3 could be applied to determine if the programmed state was 00 or 01.

FIG. 6 shows another charge distribution 160 to illustrate the observed shifting of charge observed as a result of the floating body effect. The distribution 160 corresponds to one of the distributions from FIG. 5 and represents the normal variation for a given state. Shifted distribution 162, shown in broken line fashion, shows a pronounced first read shift that is experienced the first time a set of the memory cells is read during a normal read operation after the memory cells were programmed. Other directions of shifting may occur, although in most cases it is contemplated that the accumulated charge will require higher control gate (WL) voltages to place the memory cells in a conductive state, thereby appearing to shift the distribution as shown. Subsequent reads will more accurately sense the population as corresponding to distribution 160.

Figure 7:
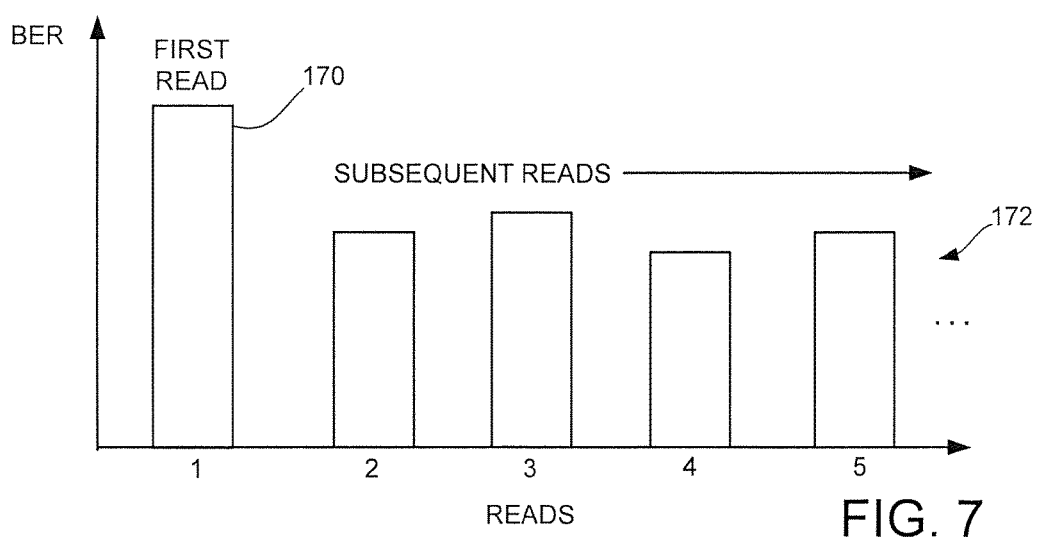
FIG. 7 shows a step-wise improvement in observed bit error rate (BER) after the first read after a programming operation.

FIG. 7 shows a graphical representation of a step-function bit error rate (BER) response for a given set of memory cells. The data shown in FIG. 7 is merely illustrative and not drawn to scale. Generally, the higher the BER along the y-axis, the higher the number of read errors experienced in the recovered data. Other conventions may be used.

As demonstrated by FIG. 7, a first read operation, indicated at bar 170, provides a statistically significant increase in the number of observed bit errors as compared to subsequent read operations, generally indicated at 172. The actual steady-state BER level will thereafter remain generally in this lower range after the step-function decrease from the first read. Eventually, longer term effects such as read disturb, temperature, adjacent reads/writes, etc. may ultimately increase the BER to the point where the data require rewriting to a new location. Nevertheless, the lower BER will continue to be experienced for some reasonable amount of time after the first read.

Figure 8:
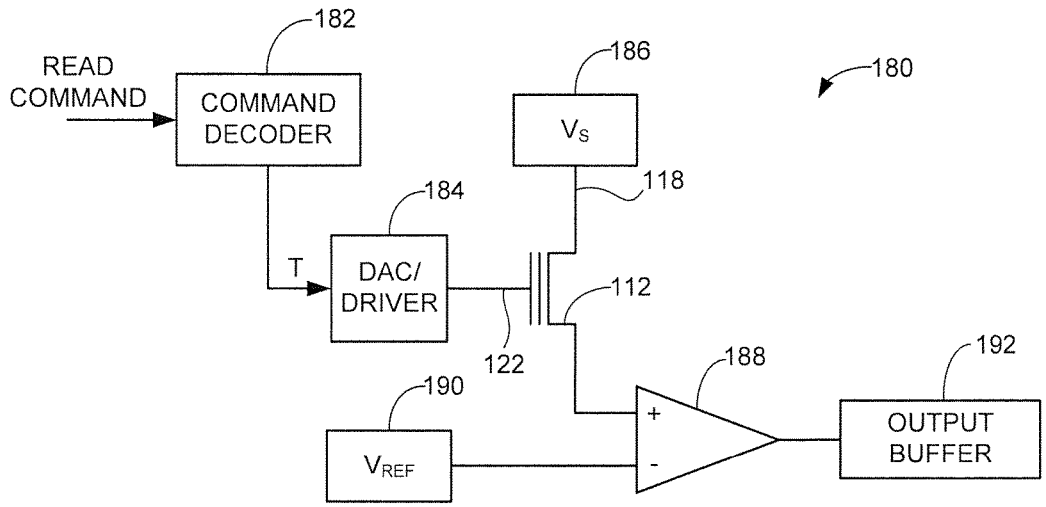
FIG. 8 depicts a read/program verify circuit adapted to read the storage states of the memory cells of FIG. 4 in accordance with some embodiments.

FIG. 8 is a functional block representation of a read/program verify (PV) circuit 180 of the storage device 100 in accordance with some embodiments. The circuit 180 is adapted to apply the read voltage thresholds of FIG. 5 during read operations as illustrated in FIG. 7 to detect the program states of the respective memory cells 112 in the array 110. Program verify operations during programming can also be carried out by the circuit, or a different dedicated circuit having a similar construction.

A command decoder 182 decodes an input read command and outputs an appropriate read threshold value T to a digital-to-analog (DAC) driver circuit 184. The threshold value T is a multi-bit digital representation of a selected analog voltage value such as from FIG. 5 (e.g., voltage V1, V2, V3 or V4), or some other programmable value. The DAC/driver 184 applies the corresponding analog voltage to the gate structure of the selected cell 112 via the associated word line 122 (see FIG. 2).

A voltage source 186 applies a suitable source voltage $V_S$ to the bit line 118 coupled to the memory cell 112 being read. A sense amplifier 188 determines whether the applied voltage is sufficient to place the cell 112 into a conductive state through a comparison with a reference voltage $V_{REF}$ from a reference voltage source 190. A resulting bit value is output to an output buffer 192 (e.g., a 0 or 1) responsive to the comparison. At this point it will be appreciated that program verify and read operations are carried out in a similar fashion. One difference is that a read operation for a memory cell storing more than a single bit may require multiple different voltage thresholds to discern the program state, whereas a program verify operation may involve the application of only a single voltage.

Figure 9:
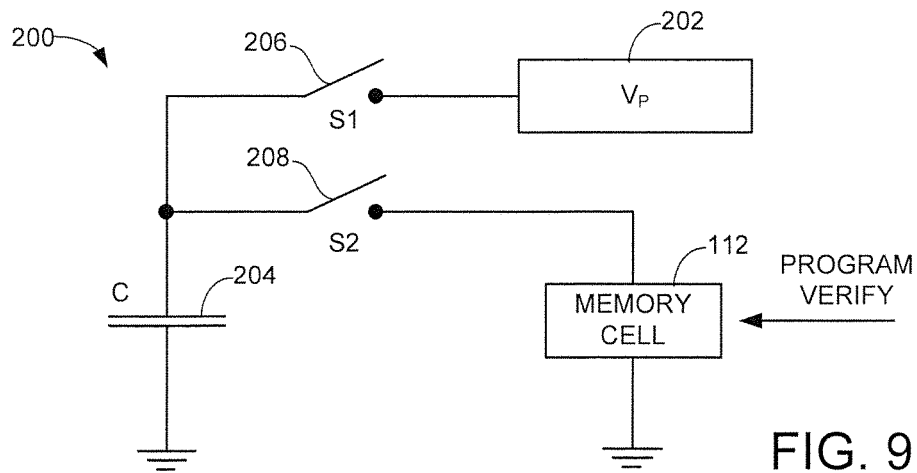
FIG. 9 illustrates a programming circuit adapted to write the storage states of FIG. 6 in accordance with some embodiments.

FIG. 9 is a functional block representation of a data programming circuit 200 of the data storage device 100. The circuit 200 is configured to transfer charge to the floating gates of the various memory cells 112 during programming operations.

The circuit 200 takes a general charge pump configuration with a programming voltage source 202 that supplies a suitable programming voltage $V_P$, a capacitor (C) 204 or other charge storage device, and a pair of switches 206, 208 denoted as switches S1 and S2. The switches can take any suitable form such as power MOSFETs.

The circuit operates to transfer discrete quanta of charge to the floating gate. To this end, one or more charge-transfer cycles are applied to the memory cell. During a charge cycle, switch S1 is closed, switch S2 is opened, and charge accumulates as the voltage $V_P$ is applied to the capacitor C. During a transfer cycle, switch S1 is opened and switch S2 is closed, enabling a transfer of the charge accumulated by the capacitor C to the memory cell 112.

The foregoing sequence is repeated as required until the total amount of accumulated charge on the floating gate of the memory cell 112 reaches a desired level indicative of the programming of the cell to the desired programmed state. A program verify operation is periodically carried out to assess the then-existing program state of the cell, using the read circuit 180 of FIG. 8. A suitable program verify threshold is used, which may be different from the various read thresholds depicted in FIGS. 5-6.

In some cases, a program verify operation is carried out after each charge transfer. In other cases, a selected number of charge transfers are applied before the program verify operations are applied.

Figure 10:
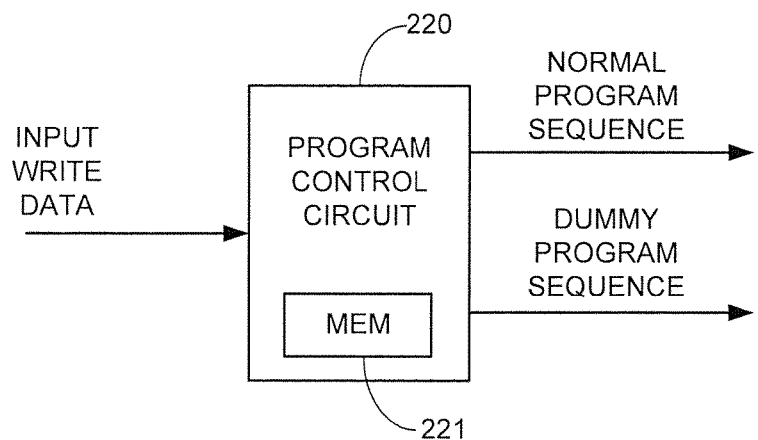
FIG. 10 is a functional block representation of a program control circuit in accordance with some embodiments.

FIG. 10 shows a program control circuit 220 used in accordance with various embodiments of the present disclosure. The program control circuit 220 can form a portion of the top level controller 102 (see FIG. 1), or can be a standalone circuit that operates in conjunction with the controller. The program control circuit 220 directs inputs to other aspects of the read/write circuitry of the device 100, such as the read/PV circuit 180 of FIG. 8 and the programming circuit 200 of FIG. 9. The program control circuit may store data and control values in a local memory (MEM) 221 during operation. The local memory 221 may also be used during other operations, such as to store previously stored data sets during a subsequent read operation.

The program control circuit 220 carries out two main programming sequences to program input data to the 3D NAND flash memory array 110. The first is a normal program sequence during which the respective circuits 180, 200 operate as discussed above to program input write data to a selected set of the memory cells 112. At the conclusion of the normal program sequence, the program control circuit 220 immediately follows up with the application of a dummy program sequence to the same set of memory cells.

The dummy program modifies the applied voltages to the memory cells to remove accumulated charge from the channel body. The bias condition can take a variety of forms depending on the construction of a given array. In some cases, the bias condition may include connecting both ends of the channel (e.g., the BL and SL) to electrical ground or other reference voltage level. The word lines (WL) may be floated or biased as required to slightly turn on each of the word lines. Other configurations may be used.

It will be noted at this point that the dummy program sequence does not alter the existing programmed states of the memory cells, but may be conditioned to operate as a follow up write (program) operation in which the system cycles through a second program effort. Special trim commands can be issued by the controller (see 102, FIG. 1) to perform the dummy program sequence. In this way, all of the pages in a given erasure block or GCU may be concurrently subjected to the process. This can be carried out efficiently by the NAND device internal logic responsive to the trim command.

Figure 11:
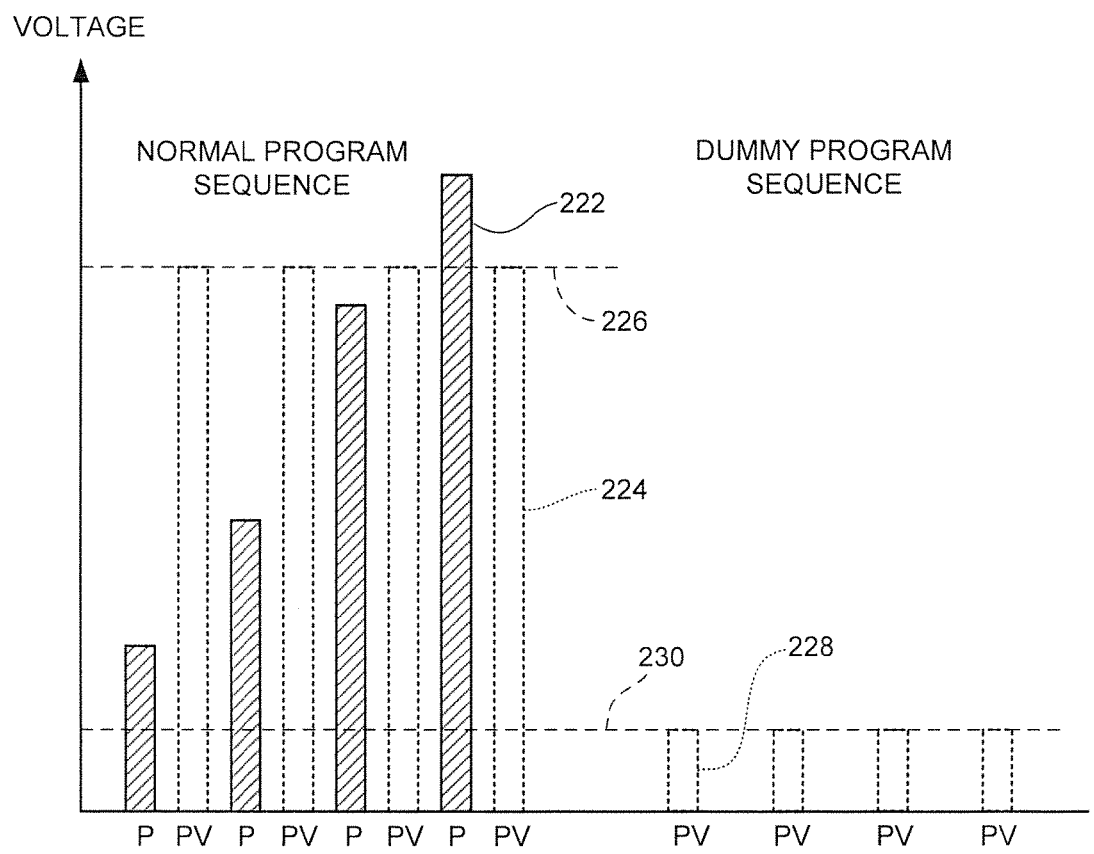
FIG. 11 illustrates respective program sequences carried out by the circuit of FIG. 10 in accordance with some embodiments.

FIG. 11 is a graphical representation of the respective normal and dummy program sequences. Bars 222 represent increases in program state of a given memory cell over successive programming (P) cycles, as discussed above in FIG. 9. The successively higher bars 222 indicate the continued accumulation of ever increasing amounts of charge on the associated floating gate.

Bars 224 represent program verify (PV) operations that are applied at the conclusion of each charge transfer cycle to determine if the desired program state has been reached, which is indicated by threshold 226. A larger number of charge transfers may be required to achieve a programmed state with a larger amount of total accumulated charge.

Bars 228 show a succession of subsequent RV pulses which are carried out as discussed above in FIG. 8. Any suitable number of successive pulses 228 may be applied, including a single pulse. It is contemplated that the pulses 228 will be similar to the program verify pulses applied at 224, except that low level sensing (including 0 volts) is applied, as indicated by PV sense threshold 230. To efficiently and effectively provide internal pathways to bleed the accumulated charge from the channel, it is contemplated that the dummy program sequence will use a lower sense threshold 230 as compared to threshold 226. The dummy sequence threshold voltage 230 may be lower than the threshold required to turn on the program states with the lowest accumulated charge (such as voltage V0 in FIG. 5). In this way, all of the memory cells may remain in a non-conductive state.

In one embodiment, the dummy program sequence can be carried out as a second programming sequence wherein a lowest program state is programmed to each of the memory cells after the desired program states have been achieved. For example, the system can operate to program each of the cells to the lowest state 11 and verify this state has been applied (e.g., voltage V1 in FIG. 5). In another embodiment, no program pulses are applied but the timing of the PV pulses are applied as if programming pulses had been supplied.

In another embodiment, different control line voltages may be respectively applied to the BL and SL (upper and lower control lines for a given memory stack; see FIG. 2). For example, during the "normal" program verify operation (bars 224) the BL may be set at some suitable rail voltage (e.g., 3.3V, etc.) and the SL may be at a reference level (e.g., electrical ground). During the "dummy" program verify operation (bars 228) both the BL and the SL may be set to electrical ground.

Figure 12:
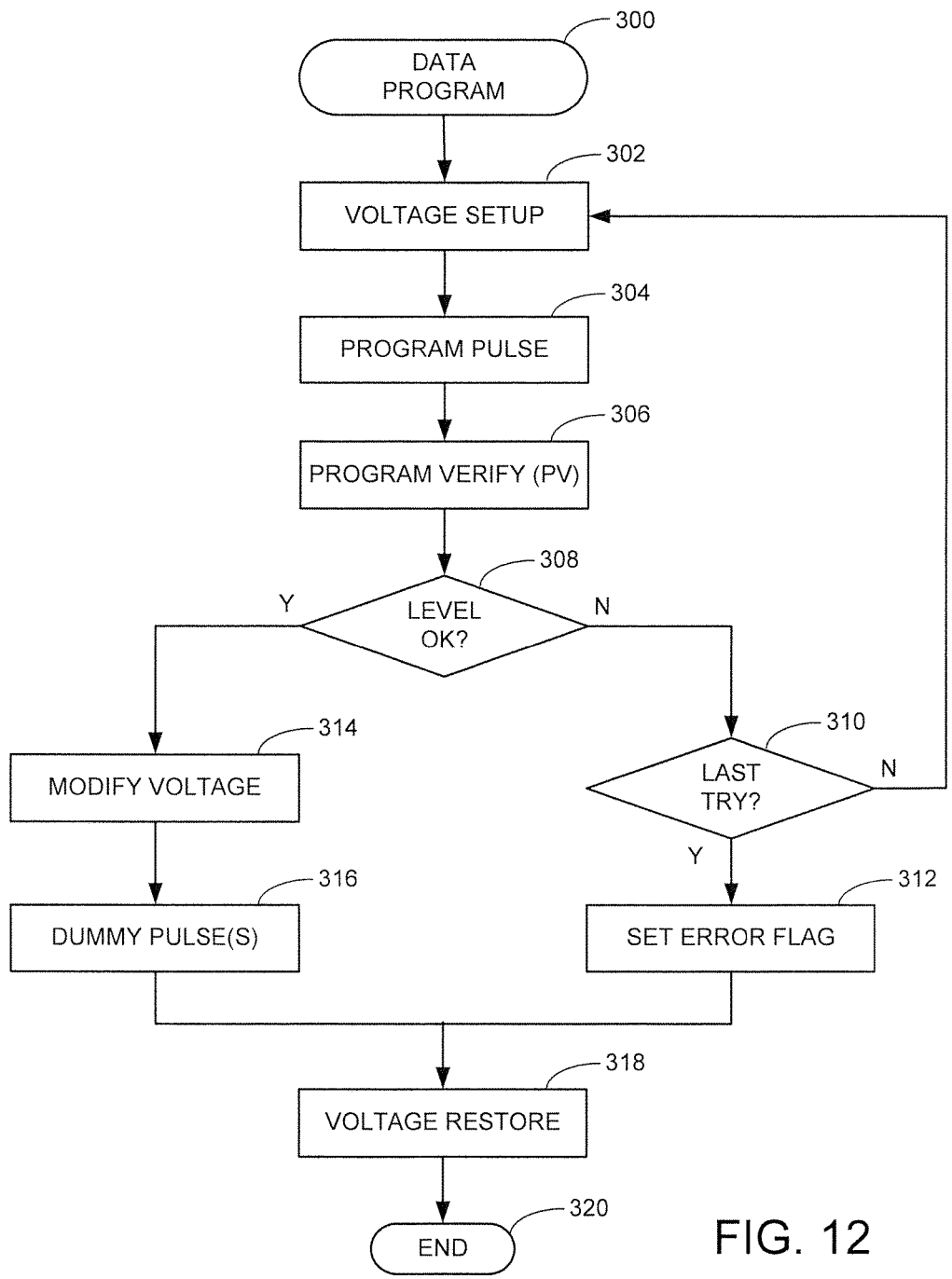
FIG. 12 is a flow chart for a DATA PROGRAM routine generally illustrative of steps carried out by the circuit of FIG. 9 in accordance with some embodiments.

FIG. 12 is a flow chart for a data program routine 300, illustrative of steps carried out in accordance with the foregoing discussion. The routine 300 may represent programming steps carried out by the program control circuit 220 of FIG. 10 during a normal program operation to program (write) input data supplied by a host device responsive to a host write command. The routine is merely illustrative and may be modified as required.

The servicing of a given host write (program) command includes a voltage setup at step 302 in FIG. 12. This includes establishing the appropriate voltages at the control lines (e.g., BL, WL, SL, SSL, GSL, etc.) to access the respective memory cells 112 to be programmed. A program pulse is next applied at step 304, which is carried out to transfer charge to the floating gate structure 140 of the associated memory cell as discussed above in FIG. 9. A program verify (PV) operation is carried out at step 306 to in response to the applied program pulse of step 304.

Decision step 308 determines whether the desired final program state has been achieved. If not, the flow passes to decision step 310 where a timeout limit is checked to determine whether a predetermined maximum number of program pulses have been applied. If not, the routine passes back to step 302 for the application of the next pulse. If the limit has been reached without the final desired program state being sensed, the flow passes to step 312 where an error flag is set, indicating a failure of the programming process. The system can proceed to address the program failure, including allocating a new location within the array 110 to store the data, deallocation of the existing memory location, etc.

At such time that the final desired program state is obtained, the flow passes from decision step 308 to step 314 where the voltages on the input control lines (e.g., BL, WL, SL, SSL, GSL, etc.) are modified to support the dummy program sequence. As mentioned previously, one way to carry this out is to assert the SSL and GSL gate control lines to place the and selection devices in a conductive state and connect the BL and SL lines to electrical ground or some other appropriate reference level.

One or more dummy pulses are thereafter applied at step 316, as described above in FIG. 11. These can include application of appropriate voltages, including but not limited to low level (e.g., including substantially zero) voltages to the various word lines to assist in the bleeding of the accumulated charge from the channel body 134 (FIG. 4).

Once either the dummy program sequence of step 316 has been completed, or an error flag has been set at step 312, the routine continues to step 318 where a voltage restore operation is carried out to return the various control lines to a normal state, after which the routine ends at step 320.

Figure 13:
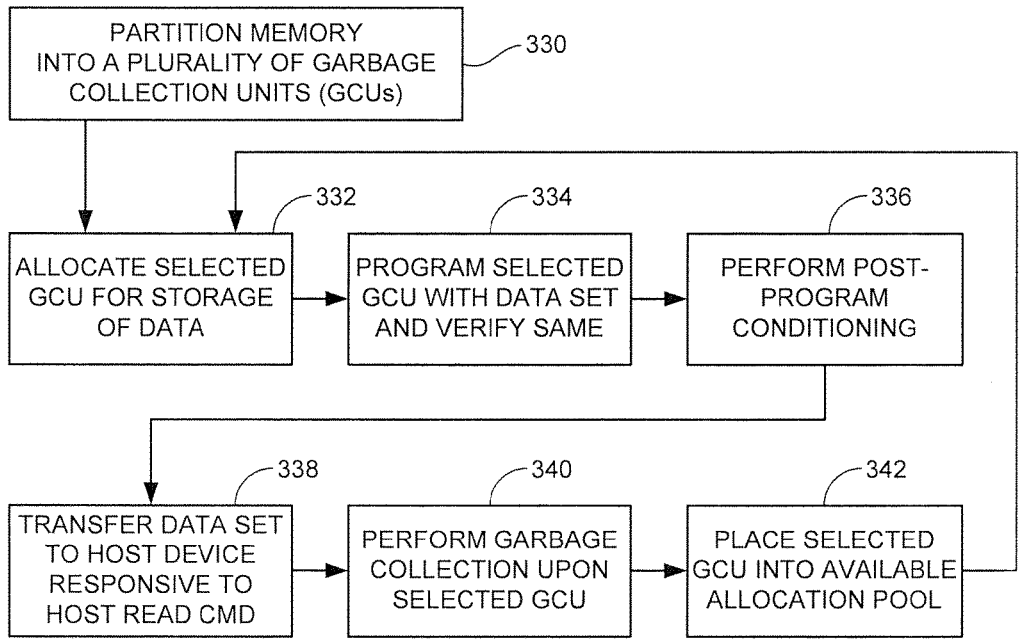
FIG. 13 is another flow sequence illustrative of steps carried out in some embodiments.

FIG. 13 provides another flow diagram to illustrate various steps that may be carried out in accordance with further embodiments. Step 330 involves partitioning a stacked memory such as the 3D NAND flash memory array 110 into a plural number of garbage collection units (GCUs). These may in turn be made up of multiple erasure blocks.

A selected GCU is allocated for the storage of user data from a host, as indicated at step 332. A user data set is transferred to the selected GCU at step 334. This will include a programming operation to program one or more stacks of memory cells in the array to desired program states, followed by a program verify (PV) operation to verify the programmed states. A post-program conditioning operation at step 336 applies the dummy program sequence to condition the verified memory cells. As will be appreciated, steps 334 and 336 generally correspond to the various steps in FIG. 12, such as programming (step 304), verifying (step 306) and conditioning (step 316), and may be carried out responsive to a host write command to write the data set to the array.

Once a given set of memory cells has been programmed, verified and conditioned, the data set stored by the memory cells is transferred to the host device one or multiple times responsive one or more host read commands at step 338. The various steps 334, 336 and 338 are repeated as necessary as new data are added to the GCU and read from the GCU responsive to various host read and write commands.

At some point, the user data stored in the selected GCU will become sufficiently stale (e.g., not the current version, read disturbed, etc.) and the system will proceed to perform a garbage collection operation upon the selected GCU, step 340. This may include copying current version data sets from the selected GCU to another available GCU, followed by the application of an erasure operation to reset all of the memory cells 112 in the selected GCU to an initial erased state (e.g., state 11 as depicted in FIG. 5). Once erased, the selected GCU is placed into an allocation pool of available GCUs at step 342, and the foregoing process steps are repeated.

Figure 14:
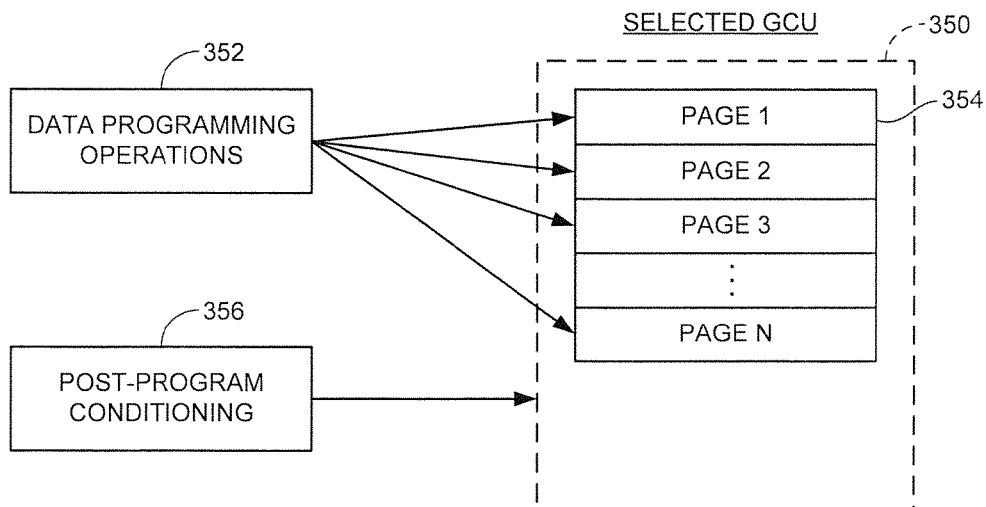
FIG. 14 shows another sequence of data programming and conditioning in accordance with some embodiments.

FIG. 14 shows another processing diagram to illustrate yet further embodiments. A selected GCU is generally referenced at 350. Data programming operations are carried out as indicated by block 352 to write data sets to each of a plurality of pages of memory 354. Once a total number of N data sets have been written to N corresponding pages, a single post-program conditioning operation can be applied as indicated at step 356. The post-program conditioning can be applied just to the N pages or a larger portion of the selected GCU 350, including all of the memory cells therein.

While 3D NAND flash memory has been used as a particular example, it will be appreciated that any number of stacked non-volatile solid-state memory cells may benefit from the disclosed technique.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
   programming a stack of memory cells in a three-dimensional (3D) non-volatile semiconductor memory array to a desired set of program states;
   applying a first set of pulses to verify the stack of memory cells conforms to the desired set of program states; and
   conditioning the verified stack of memory cells by applying a different, second set of pulses to remove accumulated charge from a shared channel region of the stack after the stack of memory cells have been verified as conforming to the desired set of program states by the first set of pulses, the second set of pulses having a magnitude insufficient to place any of the memory cells in the stack of memory cells in a conductive state.

2. The method of claim 1, wherein the first set of pulses have a first maximum magnitude, and the second set of pulses have a second maximum magnitude less than the first maximum magnitude.

3. The method of claim 1, wherein the programming, applying and conditioning steps are sequentially carried out responsive to receipt of a host write command to write a selected data set, received from a host device, to the memory array from a host device.

4. The method of claim 3, further comprising subsequently receiving a host read command from the host device after completion of the host write command, and servicing the host read command by performing a read operation upon the conditioned and verified stack of memory cells to transfer the selected data set to the host device.

5. The method of claim 4, wherein the host read command is the first read command received from the host device associated with the selected data set since receipt and execution of the host write command for the selected data set.

6. The method of claim 1, wherein the memory cells in the stack of memory cells comprise flash memory cells of a 3D NAND flash memory array and the programming step comprises transferring and accumulating charge on floating gate structures of the flash memory cells.

7. The method of claim 1, wherein the second set of pulses have a magnitude below a lowest programming threshold sufficient to detect a programming state of the memory cells corresponding to a lowest amount of accumulated charge.

8. The method of claim 1, wherein the first set of pulses are applied to respective control gates of the stack of memory cells and the program states of the memory cells are verified responsive to the first set of pulses placing the respective memory cells in a conductive state.

9. The method of claim 8, wherein the second set of pulses are applied to the respective control gates of the stack of memory cells and are of insufficient magnitude to place the respective memory cells in a conductive state.

10. The method of claim 1, wherein the programming and applying steps are successively applied to a plurality of different stacks of memory cells in the memory array and the conditioning step is simultaneously applied to all of the different stacks of memory cells.

11. The method of claim 1, wherein the programming and applying steps form a portion of a normal programming sequence carried out by the memory array responsive to a normal programming command issued by a control circuit associated with the memory array, and the conditioning step is carried out by the memory array responsive to a dummy programming command issued by the control circuit at a conclusion of execution of the normal programming command, the dummy programming command issued prior to issuance of a read command by the control circuit to the memory array to initially retrieve a data set to a local memory corresponding to the set of desired program states.

12. A method comprising:
programming a data set to a stack of memory cells in a three-dimensional (3D) non-volatile semiconductor memory array by applying a sequence of charge pulses to respectively accumulate different amounts of charge within the memory cells corresponding to bit values of the data set, followed by applying a first sequence of program verify (PV) pulses to verify the respective different amounts of charge correspond to desired programmed logical states corresponding to the bit values of the data set; and applying a second sequence of PV pulses to the memory cells after each of respective different amounts of charge have been verified as corresponding to the desired programmed logical states to condition the memory cells prior to an initial read operation to subsequently transfer the data set to a host device, the second sequence of PV pulses having a voltage magnitude that is lower than a voltage threshold required to transition, to a conductive state, the memory cells in the stack programmed to the programmed logical state corresponding to a lowest amount of accumulated charge.

13. The method of claim 12, wherein the first sequence of PV pulses have a first maximum magnitude, and the second sequence of PV pulses have a second maximum magnitude less than the first maximum magnitude.

14. The method of claim 12, further comprising a prior step of receiving a host write command from a host device to write the data set to the memory array, and the programming and applying steps are sequentially carried out responsive to the host write command.

15. The method of claim 14, further comprising subsequent steps of receiving a host read command from the host device to read the data set from the memory array, and performing a read operation upon the memory cells to transfer the data set to the host device responsive to the host read command, the host read command comprising a first read command received from the host to request the data set after receipt of the host write command.

16. The method of claim 12, wherein the memory cells are connected in series between upper and lower control lines, the first set of PV pulses is applied to control gates of the memory cells while a first set of voltages is applied to the upper and lower control lines, and the second set of PV pulses is applied to the control gates of the memory cells while nominally zero volts is applied to each of the upper and lower control lines.

17. A data storage device, comprising:
a three-dimensional (3D) non-volatile semiconductor memory array comprising a plurality of stacks of memory cells, each stack of memory cells comprising a plurality of memory cells sharing a central channel region; and
a control circuit configured to program a selected stack of memory cells to a desired set of program states by applying a first set of pulses to the selected stack, verify the memory cells in the selected stack conform to the desired set of program states by applying a second set of pulses to the selected stack, and to condition the memory cells in the selected stack by applying a third set of pulses to the selected stack, the third set of pulses removing accumulated charge in the central channel region of the selected stack, the third set of pulses comprising dummy pulses having magnitudes insufficient to place any of the memory cells in any of the stacks of memory cells in a conductive state.

18. The data storage device of claim 17, wherein the first set of pulses comprise charge transfer pulses to transfer quanta of electrical charge to floating gate structures of the memory cells in the selected stack, the second set of pulses comprise normal program verify pulses which verify the memory cells have accumulated sufficient quanta of electrical charge on the floating gate structures to correspond to the desired set of program states by placing the memory cells in a conductive state, and the third set of pulses comprise dummy program verify pulses of insufficient magnitude to place any of the memory cells in the selected stack in a conductive state.

19. The data storage device of claim 17, wherein the memory array is a 3D NAND flash memory array.

20. The data storage device of claim 17, wherein the memory array further comprises upper and lower control lines respective attached to each of the stacks of memory cells, and the third set of pulses comprise pulses applied to control gates of the memory cells in the selected stack and connecting each of the upper and lower control lines attached to the selected stack to electrical ground.

* * * * *